(12) United States Patent
Loeliger et al.

(10) Patent No.: US 7,451,174 B2
(45) Date of Patent: Nov. 11, 2008

(54) MULTI-LEVEL SOFT DETECTOR-QUANTIZER

(75) Inventors: Hans-Andrea Loeliger, Zürich (CH); Matthias Urs Frey, Zürich (CH); Patrick Peter Merkli, Baden (CH)

(73) Assignee: Anadec GmbH, Cham (CH)

( * ) Notice: Subject to any disclaimer, the term of this patent is extended or adjusted under 35 U.S.C. 154(b) by 798 days.

(21) Appl. No.: 11/081,182

(22) Filed: Mar. 16, 2005

(65) Prior Publication Data

US 2006/0212504 A1    Sep. 21, 2006

(51) Int. Cl.
*G06G 7/00* (2006.01)
(52) U.S. Cl. .................................... 708/801
(58) Field of Classification Search ............... 708/801
See application file for complete search history.

(56) References Cited

U.S. PATENT DOCUMENTS

| | | | | |
|---|---|---|---|---|
| 4,374,335 | A | 2/1983 | Kukahori et al. | 307/521 |
| 5,059,814 | A | 10/1991 | Mead et al. | 307/201 |
| 5,764,559 | A | 6/1998 | Kimura | 364/841 |
| 6,282,559 | B1 | 8/2001 | Helfenstein et al. | 708/801 |
| 6,584,486 | B1 * | 6/2003 | Helfenstein et al. | 708/835 |
| 6,844,782 | B2 * | 1/2005 | Otaka | 330/254 |
| 2006/0192610 | A1 * | 8/2006 | Hirobe et al. | 327/540 |

FOREIGN PATENT DOCUMENTS

| | | |
|---|---|---|
| DE | 1 975 25 275 A1 | 12/1998 |
| DE | 198 15 825 A1 | 10/1999 |
| EP | 1 024 450 A1 | 8/2000 |

OTHER PUBLICATIONS

J. Hagenauer et al., Decoding and Equalization with Analog Non-Linear Networks, European Transactions on Telecommunications, vol. 10, No. 6, 659-680, Dec. 1999.
J. Hagenauer et al., A Circuit Based Interpretation of Analog MAP Decoding with Binary Trellises, TG Fachtaging, 175-180, Jan. 2000.
M. Vedat Eyuboglu et al., Reduced-State Sequence Estimation with Set Partioning and Decision Feedback, IEEE Transactions on Communications, vol. 36, No. 1, Jan. 13-20, 1988.
C. Toumazou et al., Switched-Currents an Analogue Technique for Digital Technology,IEEE Circuits and Systems, Series 5, Chapter 3, 30-70, 1993.

(Continued)

*Primary Examiner*—Tan V Mai
(74) *Attorney, Agent, or Firm*—Ohlandt, Greeley, Ruggiero & Perle, LLP; George W. Rauchfuss, Jr.

(57) ABSTRACT

An analog electronic circuit is proposed that e.g. computes the symbol likelihoods for PAM or QAM signal constellations. The circuit has at least one set of M transistors connected to a common current source. A multiplier/adder generates the voltages to be applied to the transistors from a value y and a set of M expected values in such a way that the currents through the transistors correspond to the likelihood that the value y corresponds to the expected values. The circuit can be used for signal demodulation and various other applications.

19 Claims, 6 Drawing Sheets

OTHER PUBLICATIONS

H-A Loeliger et al., Decoding in Analog VLSI, IEEE Communications, vol. 37, No. 4, 99-101, Apr. 1999.

H-A Loeliger et al., Probability Propagation and Decoding in Analog VLSI, Proceedings 1998 IEEE Intl. Symposium on Information Technology, 146, 1998.

F. Lustenberger et al., An Analog VLSI Decoding Technique for Digital Codes, ISCAS Proceedings, II-424-II-427, May 30-Jun. 2, 1999.

B. Gilbert, A Precise Four-Quadrant Multiplier with Subnanosecond Response, IEEE Journal Solid-State Circuits, vol. Sc-3, No. 4, 365-373, Dec. 1968.

B. Gilbert, A Monolithhic 16-Channel Analog Array Normalizer,IEEE Journal of Solid-State Circuits, vol. Sc-19, No. 6, 956-963, Dec. 1984.

J. Dauwels et al., On Structured-Summary Propagation, LFSR Synchronization, and Low-Complexity Trellis Decoding, Allerton, 6 pages, 2003.

J.S. Yedidia et al., Generalized Brief Propagation, 7 pages, Jun. 2000 MERL.

J.S. Yedidia et al., Contructing Free Energy Approximations and Generalized Belief Propagation Algorithims, 32 pages May 2004 MERL.

H-A Loeliger, An Introduction to Factor Graphics, IEEE Signal Processing Magazine, 28-41, Jan. 2004.

H-A Loeliger et al., Decoding in Analog VLSI, IEEE Communication Magazine, 99-101, Apr. 1999.

H-A Loeliger etal., Probability Propagation and Decoding in Analog VLSI, IEEE Transactions on Information Theory, vol. 47, No. 2, 837-843, Feb. 2001.

H-A Loeliger et al, Probability Propagation and Decoding in Analog VLSI, ISIT, 1 page, Cambridge, MA, Aug. 16-21, 1998.

J. Hagenauer et al., The Analog decoder, ISIT, 145, Cambridge , MA, Aug. 16-21, 1998.

J Hagenauer, Decoding of Binary Codes with Analog Networks, Information Technology Workshop, 13-14, San Diego, CA, Feb. 8-11, 1998.

B.J. Mceliece et al., Belief Propagation on Partially Ordered Sets, Mathematical Systems Theory in Biology, Communication Computation and Finance, IMA vols. in Math Appl., 275-299, 2003.

M.H. Shakiba et al., General Approach to Implementing Analogue Viterbi Decoders, Electronic Letters, vol. 30, No. 22, 1823-1824, Oct. 27, 1994.

J. Pieter et al., Correction to "On the Error Probability for a Class of Binary Recursive Feedback Strategies", IEEE Transactions on Information Theory, 284-287, Mar. 1974.

* cited by examiner

MULTI-LEVEL SOFT DETECTOR-QUANTIZER

BACKGROUND OF THE INVENTION

The invention concerns an analog electronic circuit and calculation and demodulation method that solve a problem which appears in receivers of digital communications and elsewhere, especially in connection with analog decoders.

For example, consider a communication system that uses PAM (pulse amplitude modulation) signaling. Assuming AWGN (additive white Gaussian noise), the discrete-time channel between the modulator input in the transmitter and the matched-filter output in the receiver may be modeled as $$Y_k = h \cdot X_k + Z_k, \qquad (1)$$

where $X_k$ is the (real-valued) transmitted symbol at time k, where h is a scale factor (attenuation or gain), and where $Y_k$ is the (real-valued) received symbol at time k. The transmitted symbol $X_k$ is selected from a finite set $S=\{s_0, \ldots, s_{M-1}\}$ (a set of M real numbers). The noise process $Z_1, Z_2, \ldots$ is a sequence of independent zero-mean Gaussian random variables with variance $\sigma^2$ which is independent of the input process $X_1, X_2, \ldots$. To simplify the notation, we will drop the time index k and write (1) as $$Y = h \cdot X + Z. \qquad (2)$$

For any choice of $X = s_i$, the conditional probability density of Y is $$f_{Y|X}(y|s_i) = (2\pi\sigma^2)^{-1/2} \exp(-(y-hs_i)^2/(2\sigma^2)) \qquad (3)$$

In many types of receivers, it is necessary to compute the M numbers (likelihoods) $f_{Y|X}(y|s_0), \ldots, f_{Y|X}(y|s_{M-1})$ for the (fixed) received symbol y, up to some common scale factor. In other words, we need to evaluate (3) for $i=0, \ldots, M-1$ (up to a scale factor). In particular, these M numbers (or their logarithms) are needed as input for decoders of turbo codes and similar codes.

For any fixed y, we can write (3) as $$f_{Y|X}(y|s_i) \propto \exp(-(y-hs_i)^2/(2\sigma^2)) \qquad (4)$$

$$\propto \exp((2yhs_i - (hs_i)^2)/(2\sigma^2)), \qquad (5)$$

where "$\propto$" denotes equality up to a scale factor that does not depend on i (but may depend on y).

Now assume that the receiver contains an analog decoder for some error correcting code, e.g., as proposed in [USPatA], [LLHT:ppdavlsi2001], [Lus:davlsiid2000]. A main attraction of such decoders is that, in principle, no A/D (analog-to-digital) converter is needed. This requires, of course, that (3) (or something equivalent) is evaluated in the analog domain. For the special case M=2 (binary antipodal signaling), a simple circuit for this computation is shown in FIG. 1. The output of this circuit are two currents $I_0$ and $I_1$ with $$(I_0, I_1) \propto (f_{Y|X}(y|+1), f_{Y|X}(y|-1)). \qquad$$

This circuit was presented in the talk [Lo:dead1999c], the slides of which have long been available on the web.

For M>2, however, the computation of (3) has been an open problem. An approximate solution for 16-QAM (quadrature amplitude modulation) was recently proposed in [SLLAJ:ad2004].

BRIEF SUMMARY OF THE INVENTION

Hence, it is a general object of the invention to provide a circuit that, given a value y and a set of M>2 values $s_i$ with $i=0 \ldots M-1$, is able to calculate M values $$f(y, s_i) \propto \exp((2yhs_i - (hs_i)^2)/(2\sigma^2)) \qquad (5a)$$

for given constants h and $\sigma$, where "$\propto$" denotes equality up to a scale factor that does not depend on i (but may depend on y).

Now, in order to implement these and still further objects of the invention, which will become more readily apparent as the description proceeds, the circuit of a first aspect of the invention comprises at least one set of M transistors $T_0 \ldots T_{M-1}$, each of said transistors having a control terminal and two current terminals, wherein a voltage $V_{gate}$ at said control terminal essentially gives rise to a current $i_0 \cdot \exp((\kappa \cdot V_{gate} - V_{source})/U_T)$ through said current terminals, wherein $V_{source}$ is a voltage at a first of said current terminals and $i_0$, $\kappa$ and $U_T$ are constants dependent on transistor technology and design, a current source associated with said set of M transistors, wherein the first current terminals of said transistors are connected to said current source, a multiplier/adder associated with said set of M transistors and having an input for said value y and M outputs $O_1 \ldots O_{M-1}$ carrying voltages $U_0 \ldots U_{M-1}$, wherein, for all $i=0 \ldots M-1$, said voltage $U_i$ at output $O_i$ is $$U_i = \alpha_i \cdot y + V_i$$

with $$\alpha_i = hs_i U_T/(\sigma^2 \kappa) + c$$

and $$V_i = -\alpha_i hs_i/2 + c',$$

wherein c and c' are arbitrary constants, and wherein said multiplier/adder and said transistors are connected to apply said voltages $U_0 \ldots U_{M-1}$ to said control terminals of said transistors.

Such a circuit generates currents proportional to $f(y, s_i)$ through the second current terminals of the transistors.

In another aspect, the invention relates to a method for calculating a set of M>2 values $f(y, s_i)$ with $i=0 \ldots M-1$, from values $s_0 \ldots s_{M-1}$ and a value y, wherein $$f(y, s_i) \propto \exp((2yhs_i - (hs_i)^2)/(2\sigma^2))$$

for given constants h and $\sigma$, where "$\propto$" denotes equality up to a scale factor that does not depend on i, said method comprising the steps of providing M transistors $T_0 \ldots T_{M-1}$, each of said transistors having a control terminal and two current terminals, wherein a voltage $V_{gate}$ at said control terminal essentially gives rise to a current $i_0 \cdot \exp((\kappa \cdot V_{gate} - V_{source})/U_T)$ through said current terminals, wherein $V_{source}$ is a voltage at a first of said current terminals and $i_0$, $\kappa$ and $U_T$ are constants dependent on transistor technology and design, wherein said transistors $T_0 \ldots T_{M-1}$ are connected to a common current source, generating M voltages $U_0 \ldots U_{M-1}$ having the values $$U_i = \alpha_i \cdot y + V_i$$

with $$\alpha_i = hs_i U_T/(\sigma^2 \kappa) + c$$

and $$V_i = -(hs_i)^2 U_T/(2\sigma^2 \kappa) + c',$$

wherein c and c' are arbitrary constants, and applying said voltages $U_0 \ldots U_{M-1}$ to said control terminals of said transistors $T_0 \ldots T_{M-1}$ such that currents flowing through said current terminals are indicative of said values $f(y, s_i)$.

Similar to the circuit of the first aspect, such a method allows to generate currents proportional to $f(y, s_i)$.

In yet another aspect, the invention relates to a method for demodulating a signal transmitted over N>0 channels, wherein, through a channel j, an actual value $y_j$ is received having a set of i=0 ... $M_j$–1 expected values $h_j \cdot s_{ij}$ with a variance $\sigma_j$, wherein $h_j$ is a scale factor of channel j and $s_{ij}$ is one symbol of a set $S_j$ of $M_j$ possible symbols to be transmitted over channel j, said method comprising the steps of for each channel j, providing $M_j$ transistors $T_0 \ldots T_{Mj-1}$, each of said transistors having a control terminal and two current terminals, wherein a voltage $V_{gate}$ at said control terminal essentially gives rise to a current $i_0 \cdot \exp((\kappa \cdot V_{gate} - V_{source})/U_T)$ through said current terminals, wherein $V_{source}$ is a voltage at a first of said current terminals and $i_0$, $\kappa$ and $U_T$ are constants dependent on transistor technology and design, wherein said transistors $T_0 \ldots T_{Mj-1}$ are connected to a common current source, for each channel j, generating $M_j$ voltages $U_{0,j} \ldots U_{Mj-1,j}$ having the values $$U_{i,j}=\alpha_i \cdot y+V_i$$

with $$\alpha_i=h_j s_{ij} U_T/(\sigma_j^2 \kappa)+c$$

and $$V_i=-(hs_i)^2 U_T/(2\sigma^2 \kappa)+c',$$

wherein c and c' are arbitrary constants, and for each channel j, applying said voltages $U_{0,j} \ldots U_{Mj-1,j}$ to said control terminals of said transistors $T_0 \ldots T_{Mj-1}$ for generating a set of currents $I_{i,j}$ indicative of the likelihoods that said actual value $y_j$ corresponds to said expected values $h_j \cdot s_{ij}$.

This method can be applied to single transmission channels (N=1), such as in PAM, as well as multiple transmission channels (N>1), such as in QAM (N=2).

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Figure 1:
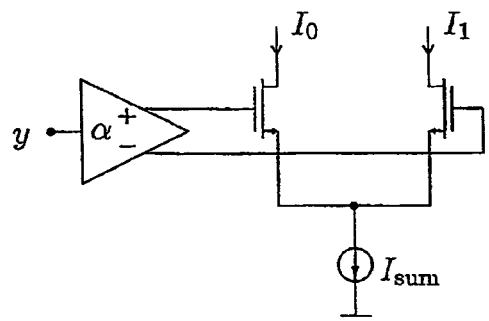
FIG. 1 shows a prior art circuit to compute the symbol likelihoods (as currents $I_0$ and $I_1$) for binary antipodal signaling.

The present invention is a circuit to compute (3) exactly (up to a scale factor), both for general M-PAM and for general M-QAM. For M=2, the new circuit coincides with the previously known circuit of FIG. 1. The new circuit has further applications such as, e.g., in trellis coded quantization.

The new circuit may be realized both with bipolar transistors and with MOS field effect transistors; in order to obtain an exact computation, the latter have to operate in subthreshold mode (i.e., weak-inversion).

In general, each such transistor has a control terminal, which is the gate for FET transistors or the base for bipolar transistors. In addition, each transistor has two current terminals, which are the source and drain for FET transistors or the emitter and collector for bipolar transistors. In the following, we will use the notation (including the circuit symbols) of MOS transistors.

In saturation (i.e., in the active region), such a transistor is a voltage controlled current source described in good approximation by $$I_{drain}=i_0 \cdot \exp((\kappa \cdot V_{gate}-V_{source})/U_T), \qquad (7)$$

where $I_{drain}$ is the drain current, $V_{gate}$ is the gate potential, $V_{source}$ is the source potential, $U_T$ is the thermal voltage, $i_0$ is some technology and design dependent current, and $\kappa$ is some technology dependent dimensionless constant.

Figure 2:
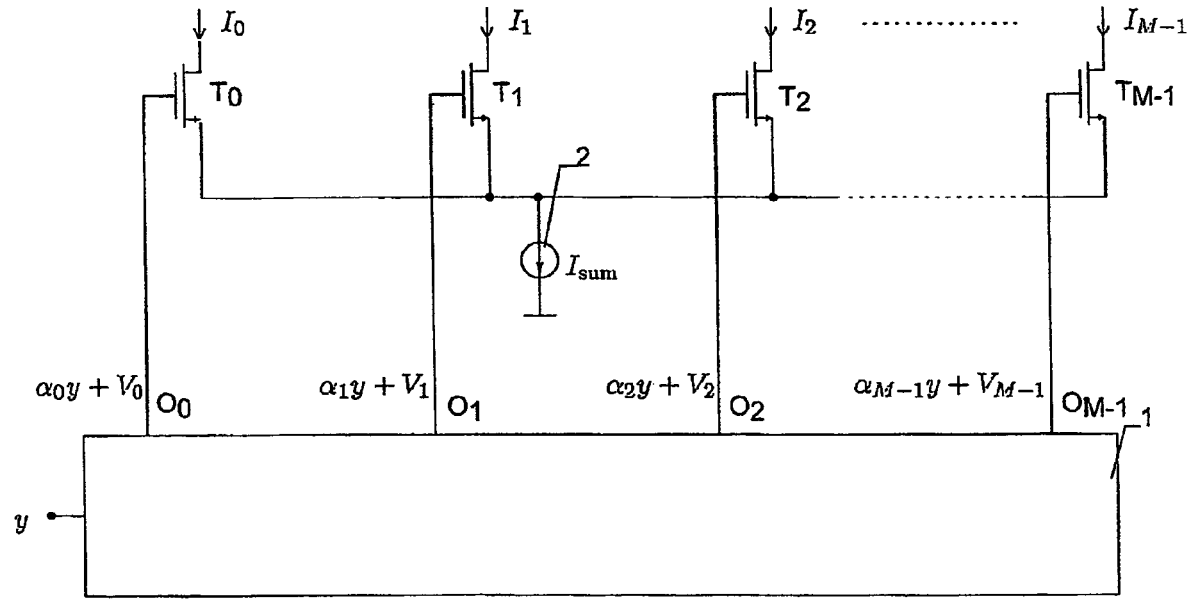
FIG. 2 shows the new circuit with input y and output currents $I_0, \ldots, I_{M-1}$.

The proposed new circuit is shown in FIG. 2. The circuit consists of M transistors $T_0 \ldots T_{M-1}$, the sources (i.e. first current terminals) of which are connected to a common current source 2. The circuit further comprises a multiplier/adder 1 that takes y as input and generates the gate potentials of the M transistors at outputs $O_0 \ldots O_{M-1}$. The gate potential $U_i$ of the i-th transistor is $\alpha_i y+V_i$ with parameters $\alpha_i$ and $V_i$ that will be discussed below. The output $O_i$ of the circuit are the M drain currents $I_0, \ldots, I_{M-1}$. Using (7), these currents are given by $$I_i=I_0 \exp((\kappa \cdot V_{gate,i}-V_{source})/U_T)$$

$$\propto \exp(\kappa \cdot V_{gate,i}/U_T)$$

$$\propto \exp((\alpha_i y+V_i) \cdot \kappa/U_T) \qquad (10)$$

where, as above, "$\propto$" denotes equality up to a scale factor that does not depend on i (but may depend on y). With a proper choice of $\alpha_i$ and $V_i$, we will obtain $I_i \propto f_{Y|X}(y|s_i)$. A proper choice is $$\alpha_i=hs_i U_T/(\sigma^2 \kappa)+c, \qquad (11)$$

where c is some arbitrary constant, and $$V_i=-(hs_i)^2 U_T/(2\sigma^2 \kappa)+c' \qquad (12)$$

where c' is another arbitrary constant. We then have $$I_i \propto \exp((\alpha_i y+V_i) \cdot \kappa/U_T)$$

$$\propto \exp(((\alpha_i-c)y+(V_i-c')) \cdot \kappa/U_T)$$

$$\propto \exp(yhs_i/\sigma^2-(hs_i)^2/(2\sigma^2))$$

$$\propto f_{Y|X}(y|s_i), \qquad (16)$$

where the last step follows from (5). With $\alpha_i$ and $V_i$ as in (11) and (12), the circuit of FIG. 2 thus computes the desired quantities $f_{Y|X}(y|s_0), \ldots, f_{Y|X}(y|s_{M-1})$ (up to a scale factor) simultaneously as output currents. We also note that, with the natural choice c=0, we have $$\alpha_i = h s_i U_T/(\sigma^2 \kappa) \quad (17)$$

and $$V_i = -\alpha_i h s_i/2 + c'. \quad (18)$$

Figure 3:
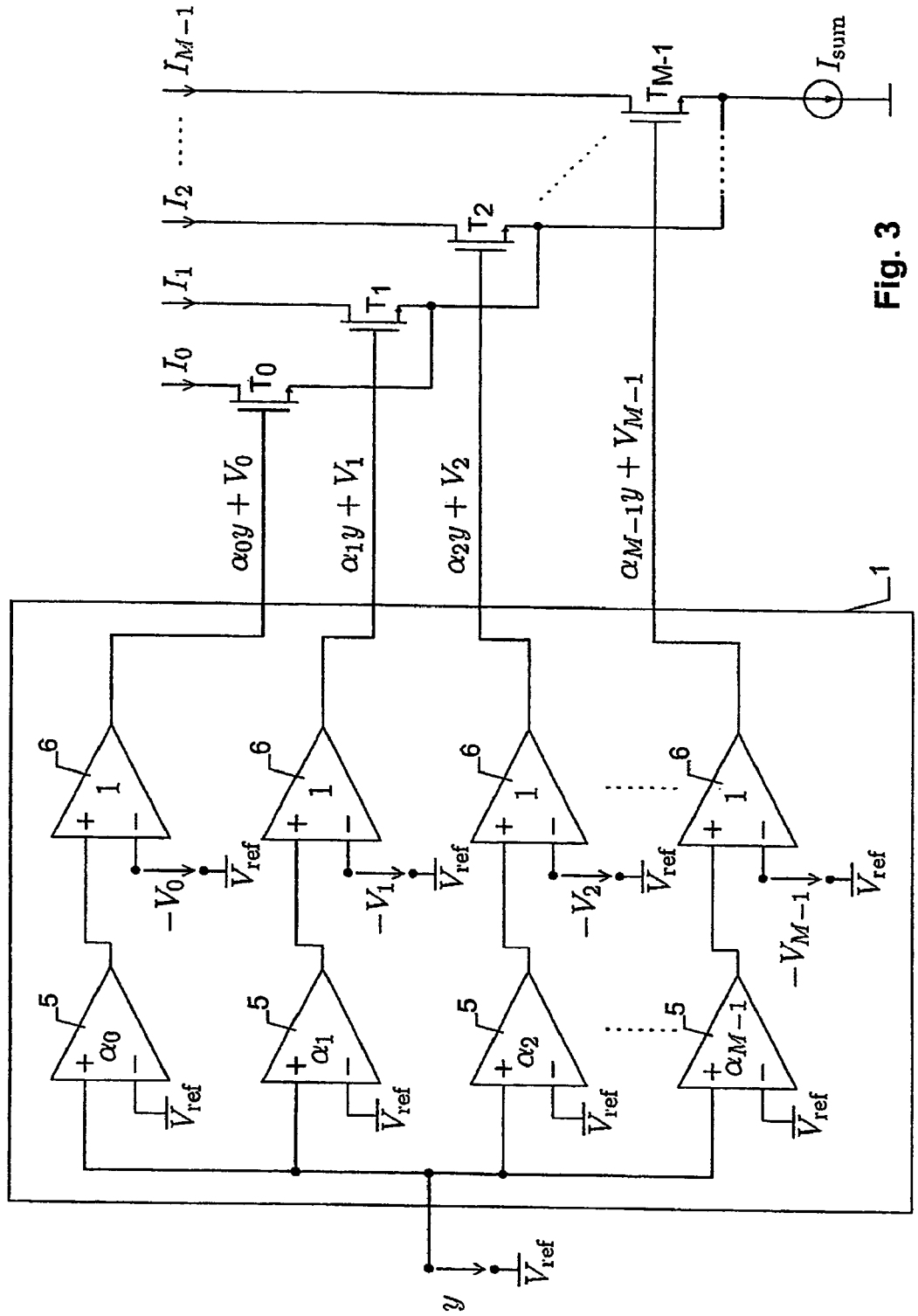
FIG. 3 shows the circuit of FIG. 2 with an implementation of the multiplier/adder.
Figure 4:
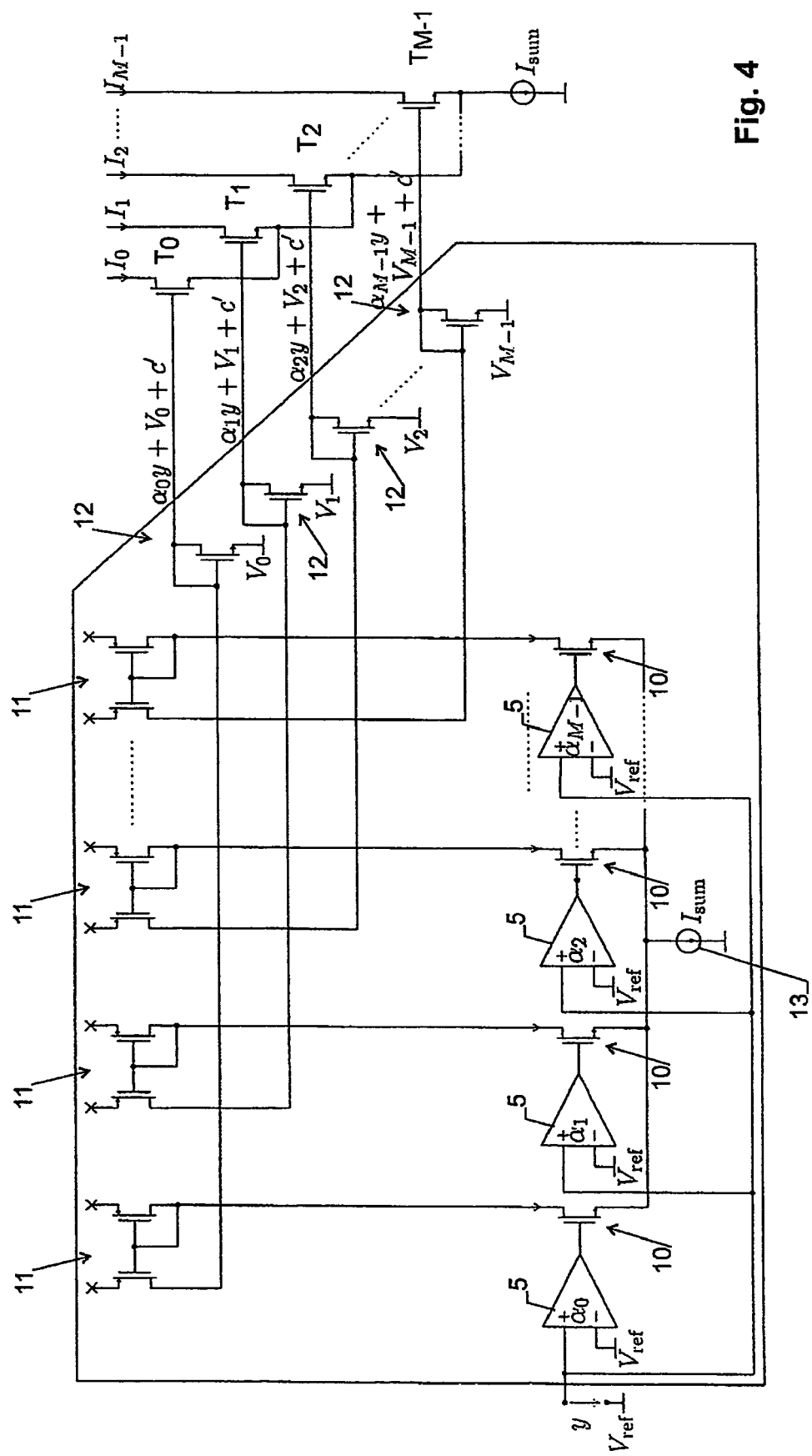
FIG. 4 shows the circuit of FIG. 2 with another implementation of the multiplier/adder.

The multiplier/adder in FIG. 2 is advantageously implemented using analog circuitry, e.g., as in FIG. 3 or as in FIG. 4.

In the embodiment of FIG. 3, two operational amplifiers 5 and 6 are used for generating each gate voltage $U_i = \alpha_i y + V_i$. A first operational amplifier 5 amplifies y by $\alpha_i$ to generate $\alpha_i y$ and a second operational amplifier 6 adds $V_i$ to $\alpha_i y$.

In the embodiment of FIG. 4, for each i, one operational amplifier 5 with an amplification $\alpha_i$ is used to generate $\alpha_i y$. The addition of the voltage $V_i$ is carried out by generating a current proportional to $\exp(\alpha_i y)$ by feeding $\alpha_i y$ to the gate of a transistor 10. All transistors 10 are fed by a common current source 13, which allows to obtain well defined current levels in the transistors. The current of each transistor 110 is mirrored by a current mirror 11 and fed to the gate of a diode connected transistor 12 connected to the potential $V_i$, which generates a voltage proportional to the logarithm of the current with reference to $V_i$. The embodiment of FIG. 4 is advantageous because it requires a comparatively small number of transistors.

In order to compute $\alpha_i$ and $V_i$ according to (17) and (18) or (11) and (12), the quantities h and $U_T/(\sigma^2\kappa)$ need to be known or estimated, e.g. from calibration measurements. Alternatively, the amplifications $\alpha_i$ and the offsets $V_i$ may be controlled by a feedback loop that monitors the statistics of the computed currents $I_i$ and adjusts $\alpha_i$ and $V_i$ accordingly.

Extensions and Applications

QAM

The proposed circuit is easily extended to compute the symbol likelihoods for QAM (quadrature amplitude modulation) and for more general N-dimensional constellations. In the case of QAM, the symbols X, Y, and Z in (2), as well as the constellation symbols $\{s_0, \ldots, s_{M-1}\}$ are complex quantities as a short-hand notification for representing the two transmission channels of QAM. An example of a QAM constellation is shown in FIG. 5.

Let $X_I$ and $X_Q$ be the in-phase and the quadrature component (the real part and the imaginary part), respectively, of X. Analogously, we write $s_I$ and $s_Q$, and $Y_I$ and $Y_Q$. For the purpose of this description, the transmission of one QAM symbol X may be viewed as the transmission of the two PAM symbols $X_I$ and $X_Q$ over two separate channels. For any constellation point s, we have $$f_{Y|X}(y|s) = f_{Y_I|X_I}(y_I|s_I) \cdot f_{Y_Q|X_Q}(y_Q|s_Q). \quad (19)$$

Figure 5:
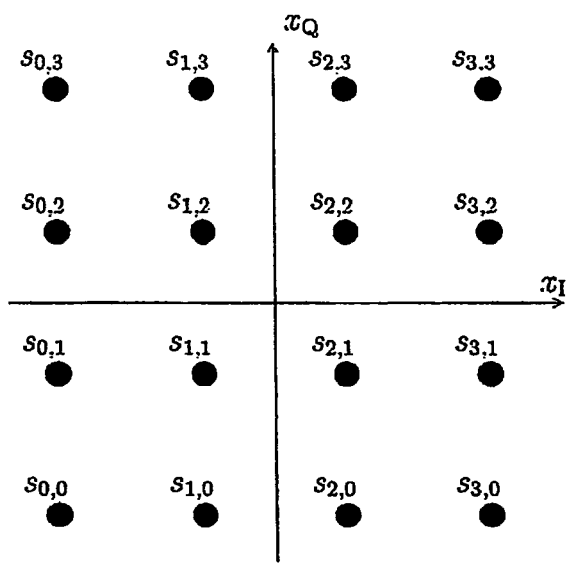
FIG. 5 shows a QAM constellation with M=16 points.
Figure 6:
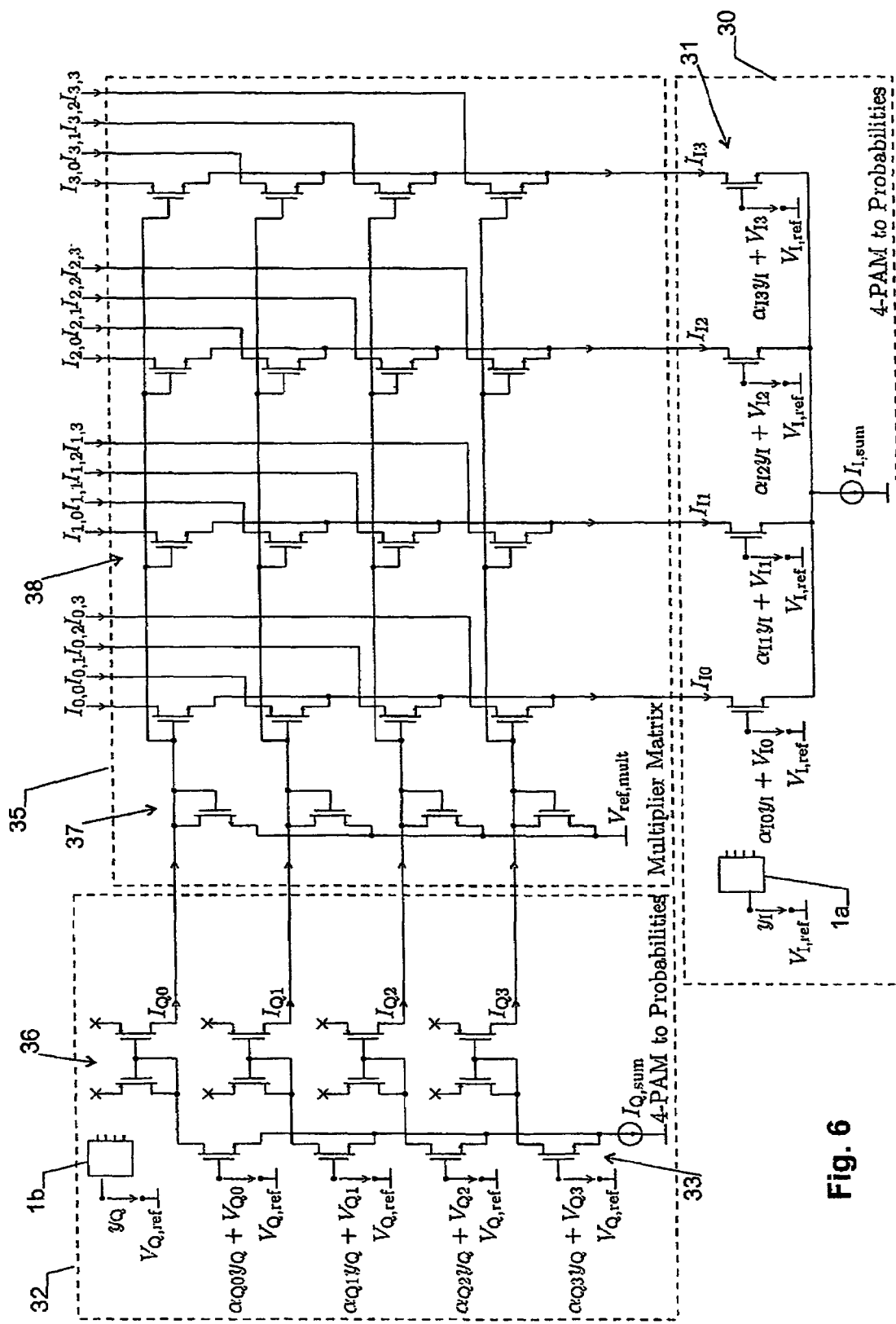
FIG. 6 shows a circuit to compute the symbol likelihoods for all points of a rectangular 16-QAM constellation.

Each of the two factors $f_{Y_I|X_I}(y_I|s_I)$ and $f_{Y_Q|X_Q}(y_Q|s_Q)$ may be computed by the circuit of FIG. 2, and the product (19) may then be computed (simultaneously for all QAM constellation points s) as shown in FIG. 6 for the 16-QAM constellation of FIG. 5. The circuit of FIG. 6 consists of three parts, as indicated by the dashed boxes.

One part/box 30 with a first set of transistors 31 provides currents $I_{I0}, \ldots, I_{I3}$ proportional to $f_{Y_I|X_I}(y_I|s_{I0}), \ldots, f_{Y_I|X_I}(y_I|s_{I3})$. The gate voltages of the set of transistors 31 is generated by a first multiplier/adder 1a, such as the multiplier/adder of FIG. 3 or 4.

A second part/box 32 with a second set of transistors 33 provides currents $I_{Q0}, \ldots, I_{Q3}$ proportional to $f_{Y_Q|X_Q}(y_Q|s_{Q0}), \ldots, f_{Y_Q|X_Q}(y_Q|s_{Q3})$. The gate voltages of the set of transistors 33 is generated by a second multiplier/adder 1b, such as the multiplier/adder of FIG. 3 or 4.

The third part/box of the circuit of FIG. 6 is a multiplier matrix 35 as described in [USPatA], [LLHT:ISIT1998], [LLHT:ppdavlsi2001] that computes all products $f_{Y_I|X_I}(y_I|s_I) \cdot f_{Y_Q|X_Q}(y_Q|s_Q)$ simultaneously as currents $I_{0,0}, I_{0,1}, \ldots, I_{3,3}$, up to a scale factor. For connecting the second set of transistors 33 to the first multiplier matrix 35, a set of current mirrors 36 and a set of diode connected transistors 37 is used for feeding a logarithm of the currents from the second set of transistors 33 to the gates of the transistors 38 of the first multiplier matrix 35. The source terminals of the transistors 38 of the first multiplier matrix are connected to the current outputs of the first set of transistors 31.

Figure 7:
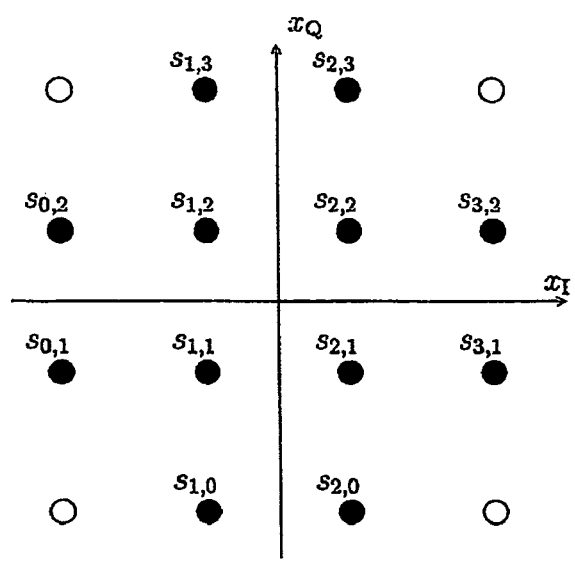
FIG. 7 shows a (non-rectangular) "cross" shaped QAM constellation.

In this way, equation (19) can be computed for any rectangular QAM constellation. A non-rectangular constellation (e.g., as in FIG. 7) may be viewed as a rectangular constellation with some unused points. For such non-rectangular constellations, the circuit of FIG. 6 may be used to compute (19) for the corresponding rectangular constellation; the drains of those transistors in FIG. 6 corresponding to unused points are then simply connected to some dummy reference potential.

More generally, an N-dimensional constellation may be viewed as a code over a (1-dimensional) PAM constellation. The quantities $f_{Y|X}(y|s)$ for the N-dimensional points s may be computed by the generalization of (19) to N dimensions.

In the N-dimensional case, the signal is transmitted over N>0 "channels". In each given channel j, the signal has a set of $M_j$ expected possible values $h_j \cdot s_{ij}$ with a variance $\sigma_j$ as in equation (3). $h_j$ is a scale factor for channel j (describing a loss or gain of the channel) and $s_{ij}$ is one of a set $S_j$ of the $M_j$ possible symbols that can be transmitted over channel j.

For each channel j, a signal $y_j$ is received.

For demodulating such a signal, each channel j is first processed separately by feeding the signal $y_j$ to a circuit as shown in FIG. 2 with $M_j$ transistors $T_0 \ldots T_{Mj-1}$ and a multiplier/adder 1. The multiplier/adder generates the $M_j$ voltages $U_{0,j} \ldots U_{Mj-1,j}$ having the values $$U_{i,j} = \alpha_i \cdot y + V_i$$

with $$\alpha_i = h_j s_{ij} U_T/(\sigma_j^2 \kappa) + c \quad (17')$$

and $$V_i = -(h_j s_{ij})^2 U_T/(2\sigma_j^2 \kappa) + c', \quad (18')$$

wherein c and c' are arbitrary constants, with c preferably set to 0. Voltage $U_{i,j}$ is applied over the gate and source of transistor $T_i$ of the set of transistors attributed to channel j. Hence, the current $I_{i,j}$ through the source and drain of said transistor $T_i$ is indicative of the likelihood that said signal $y_j$ received through channel j corresponds to the expected value $h_j \cdot s_{ij}$.

For N>1, the currents $I_{i,j}$ can be multiplied, in analogy to equation (19), for obtaining the products $$p_{i0,i1,\ldots,iN-1} = K \cdot I_{i0,0} \cdot I_{i1,1} \cdot I_{iN-1,N-1}$$

with K being proportional to $$1 \Big/ \prod_{j=0}^{N-1} \left( \sum_{i=0}^{M_j-1} I_{i,j} \right).$$

$p_{i0,i1,\ldots,iN-1}$ is indicative of the likelihood that a signal received through the channels 0 ... N−1 has the values $s_{i0,0}, \ldots s_{iN-1,N-1}$. Advantageously and as shown in FIG. 6, currents $I_{i0,i1,\ldots,iN-1}$ proportional to the products $p_{i0,i1,\ldots,iN-1}$ are generated.

From Symbol Metrics to Label Metrics

Both in trellis coded modulation [Ung:tcm1987] and in bit-interleaved coded modulation [CTB:bicm1998], [LR:bicm1998], the likelihoods $f_{Y|X}(y|s)$ of several symbols s are added up to form subset likelihoods or bit likelihoods (also called "label metrics"), which are then used by the decoder. For example, consider the PAM constellation in FIG. 8, where each point (symbol) is labeled by a two-bit binary number. The likelihood function of the most significant bit (msb) is $$\mu_{msb} = [\mu_{msb}(0), \mu_{msb}(1)]$$

$$[f_{Y|X}(y|00) + f_{Y|X}(y|01), f_{Y|X}(y|10) + f_{Y|X}(y|11)]$$

and the likelihood function of the least significant bit is $$\mu_{lsb} = [\mu_{lsb}(0), \mu_{lsb}(1)]$$

$$[f_{Y|X}(y|00) + f_{Y|X}(y|10), f_{Y|X}(y|01) + f_{Y|X}(y|11)].$$

Such functions (vectors) are easily computed (up to a scale factor) simply by adding the currents representing the involved terms $f_{Y|X}(y|s)$.

This scheme is not limited to PAM constellations or to two-bit binary numbers. For a more general description for a transmission over N>0 channels, we use the following definitions:
- T={$(s_{i0,0}, s_{i1,1}, \ldots s_{iN-1,N-1})$} designates a set of all possible N-tuples $(s_{i0,0}, s_{i1,1}, \ldots s_{iN-1,N-1})$. In the above example with N=1, T is the set S containing the symbols $s_0$ through $s_3$.
- $S_k$ with k=0 to K−1 designate K subsets of the N-tuples in T, at least part of said subsets comprising more than one N-tuple. In the above example, we had K=4, with $s_0$ (corresponding msb=0) containing $s_0$ and $s_1$, $S_1$ (corresponding msb=1) containing $s_2$ and $s_3$, $S_2$ (corresponding lsb=0) containing $s_0$ and $s_2$, $S_1$ (corresponding lsb=1) containing $s_1$ and $s_3$.

To calculate the likelihood that an N-tuple of actual values $\{y_0, \ldots y_{N-1}\}$ received through channels 0 to N−1 is indicative that a member of subset $S_k$ has been transmitted, the currents $I_{i0,i1,\ldots,iN-1}$ corresponding to all N-tuples in $S_k$ have to be added.

Iterative SISO Modules

Figure 8:
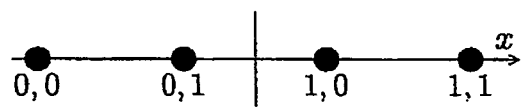
FIG. 8 shows a 4-PAM constellation with binary labels.
Figure 9:
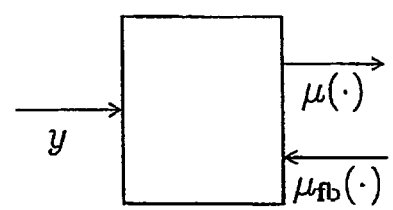
FIG. 9 represents a general soft-input soft-output (SISO) label metric computation unit.

In iterative receivers, there is often a feedback link from the decoder to the label metric computation. The label metric computation then becomes a soft-input soft-output (SISO) unit as shown in FIG. 9. For example, assume that the PAM constellation of FIG. 8 is used in a bit-interleaved coded modulation scheme (cf. [LR:biicm1998]) and let $\mu_{msb,fb}$ and $\mu_{lsb,fb}$ be the bit metrics fed back from some decoder. Then the outgoing bit metrics $\mu_{msb}$ and $\mu_{lsb}$ are $$\mu_{msb} = [\mu_{msb}(0), \mu_{msb}(1)]$$
$$= [f_{Y|X}(y|00) \cdot \mu_{lsb,fb}(0) + f_{Y|X}(y|01) \cdot \mu_{lsb,fb}(1),$$
$$f_{Y|X}(y|10) \cdot \mu_{lsb,fb}(0) + f_{Y|X}(y|11) \cdot \mu_{lsb,fb}(1)]$$

$$\mu_{lsb} = [\mu_{lsb}(0), \mu_{lsb}(1)]$$
$$= [f_{Y|X}(y|00) \cdot \mu_{msb,fb}(0) + f_{Y|X}(y|10) \cdot \mu_{msb,fb}(1),$$
$$f_{Y|X}(y|01) \cdot \mu_{msb,fb}(0) + f_{Y|X}(y|11) \cdot \mu_{msb,fb}(1)]$$

Figure 10:
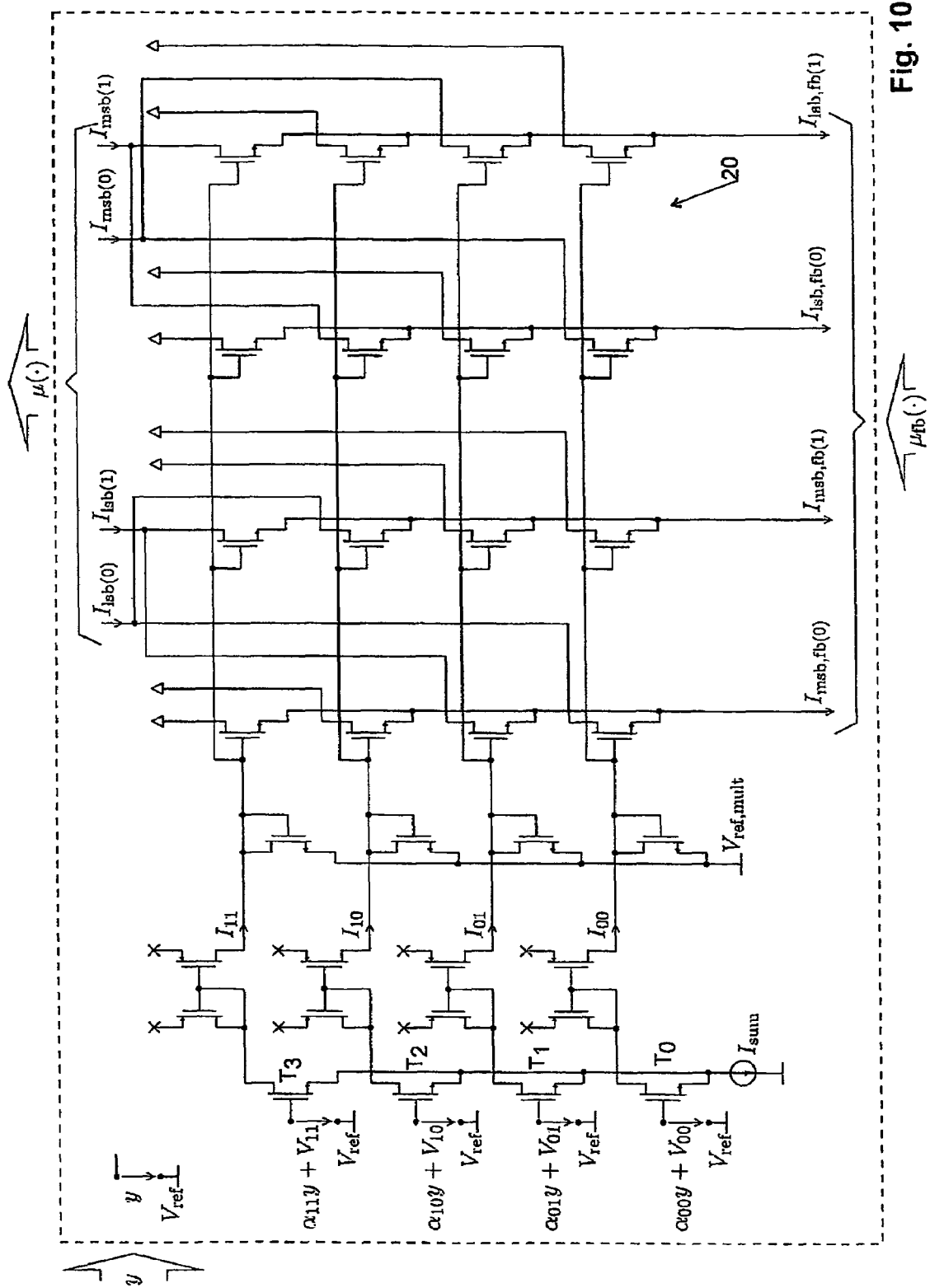
FIG. 10 is an example of a SISO label metric computation circuit.

(cf. [Lg:Brest2003]). A complete circuit to compute these bit metrics is shown in FIG. 10. The circuit comprises a second multiplier matrix 20 for multiplying each (or at least some) of the currents from the transistors $T_i$ by feedback factors $\mu_{i,fb}$. (The "multiplier matrix" in FIG. 10 is explained in [USPatA], [LLHT:ISIT1998], [LLHT:ppdavlsi2001].)

More generally, depending on the constellation (PAM, QAM), the specific labeling, and the feedback scheme (bits, symbols, . . . ), there is a large variety of metric computation schemes. All such schemes can be represented by factor graphs (cf. [Lg:Brest2003]), and the actual computations amount to sums of products of nonnegative quantities (probabilities or likelihoods). All such computations can be realized by the circuits described in [USPatA], [LLHT:ppdavlsi2001] provided that all probabilities are available as currents. The new circuit of FIG. 2 provides the symbol likelihoods $f_{Y|X}(y|s)$ as currents and thus enables such metric computations by means of circuits as in [USPatA], [LLHT:ppdavlsi2001].

Quantization

Certain N-dimensional quantization schemes (vector quantization) may be viewed as codes (of length N) over some PAM constellation. This applies, in particular, to trellis coded quantization [FW:ectcq1992]. Such a quantizer performs the same operation as a decoder for coded PAM over an AWGN channel. As above, the input to such a decoder may consist of the numbers $\exp(-(y-hs_i)^2/(2\sigma^2))$ as in (4) for i=0, . . . , M−1, where y is (one coordinate of) the analog input vector. These M numbers may be computed exactly as described above. In this context, σ is just a design parameter of the quantization algorithm.

Hence, the present invention also relates to a vector quantization device comprising at least one circuit as shown in FIG. 2 and the embodiments above.

While there are shown and described presently preferred embodiments of the invention, it is to be distinctly understood that the invention is not limited thereto but may be otherwise variously embodied and practised within the scope of the following claims.

CITED LITERATURE

[USPatA] U.S. Pat. No. 6,282,559 B1 August 2001 Helfenstein et al.

[LLHT:ISIT1998] H.-A. Loeliger, F. Lustenberger, M. Helfenstein, and F. Tarköy, "Probability propagation and decoding in analog VLSI," Proc. 1998 IEEE Int. Symp. Inform. Th., Cambridge, Mass., USA, Aug. 16-21, 1998, p. 146.

[LLHT:ppdavlsi2001] H.-A. Loeliger, F. Lustenberger, M. Helfenstein, F. Tarkoey, "Probability Propagation and Decoding in Analog VLSI," IEEE Transactions on Information Theory, vol. 47, no. 2, pp. 837-843, February 2001.

[Lus:davlsiid2000] F. Lustenberger, "On the Design of Analog VLSI Iterative Decoders," PhD Thesis no. 13879, ETH Zurich, November 2000.

[Lo:dead1999c] H.-A. Loeliger, "Decoding and equalization: iterative algorithms and analog decoding," presented at 1999 IMA Workshop on "Codes, Systems, and Graphical Models," Minneapolis, Aug. 2-13, 1999.

[SLLAJ:ad2004] F. Seguin, C. Lahuec, J. Lebert, M. Arzel, and M. Jezequel, "Analogue 16-QAM Demodulator," Electronics Letters, vol. 40, No. 18, September 2004, pp. 1138-1139.

[Ung:tcm1987] G. Ungerboeck, "Trellis-coded modulation with redundant signal sets. Part I: Introduction", IEEE Communications Mag., vol. 25, February 1987, pp. 5-11.

[CTB:bicm1998] G. Caire, G. Taricco, and E. Biglieri, "Bit-interleaved coded modulation," IEEE Trans. Information Theory, vol. 44, March 1998, pp. 927-946.

[LR:biicm1998] X. Li and J. A. Ritcey, "Bit-interleaved coded modulation with iterative decoding using soft feedback," Electronics Letters, vol. 34, May 1998, pp. 942-943.

[Lg:Brest2003] H.-A. Loeliger, "Some remarks on factor graphs," Proc. 3rd Int. Symp. on Turbo Codes and Related Topics, Sep. 1-5, 2003, Brest, France, pp. 111-115.

[FW:ectcq1992] T. R. Fischer and M. Wang, "Entropy-constrained trellis-coded quantization", IEEE Trans. Information Theory, vol. 38, March 1992, pp. 415-426.

The invention claimed is:

1. A circuit that, given a value y and a set of M>2 values $s_i$ with i=0 ... M−1, calculates M values $$f(y, s_i) \propto \exp((2yhs_i - (hs_i)^2)/(2\sigma^2))$$

for given constants h and $\sigma$, where "$\propto$" denotes equality up to a scale factor that does not depend on i, said circuit comprising at least one set of M transistors $T_0 \ldots T_{M-1}$, each of said transistors having a control terminal and two current terminals, wherein a voltage $V_{gate}$ at said control terminal essentially gives rise to a current $i_0 \cdot \exp((\kappa \cdot V_{gate} - V_{source})/U_T)$ through said current terminals, wherein $V_{source}$ is a voltage at a first of said current terminals and $i_0$, $\kappa$ and $U_T$ are constants dependent on transistor technology and design, a current source associated with said set of M transistors, wherein the first current terminals of said transistors are connected to said current source, a multiplier/adder associated with said set of M transistors and having an input for said value y and M outputs $O_1 \ldots O_{M-1}$ carrying voltages $U_0 \ldots U_{M-1}$, wherein, for all i=0 ... M−1, said voltage $U_i$ at output $O_i$ is $$U_i = \alpha_i \cdot y + V_i$$

with $$\alpha_i = hs_i U_T/(\sigma^2 \kappa) + c$$

and $$V_i = -(hs_i)^2 U_T/(2\sigma^2 \kappa) + c',$$

wherein c and c' are arbitrary constants, and wherein said multiplier/adder and said transistors are connected to apply said voltages $U_0 \ldots U_{M-1}$ to control terminals of said transistors.

2. The circuit of claim 1 wherein said transistors are FET transistors in subthreshold mode.

3. The circuit of claim 1 wherein said transistors are bipolar transistors.

4. The circuit of claim 1 wherein c=0.

5. The circuit of claim 1 wherein said multiplier/adder comprises, for each i, an amplifier for amplifying said value y by said $\alpha_i$.

6. The circuit of claim 1 wherein said multiplier/adder comprises, for each i, an adder for adding said voltage $V_i$.

7. The circuit of claim 6 wherein said adder comprises a first transistor for generating a current proportional to $\exp(\alpha_i y)$ as well as a diode connected second transistor connected to the voltage $V_i$ for generating a logarithm of the current proportional to $\exp(\alpha_i y)$ and adding said voltage $V_i$.

8. The circuit of claim 7 further comprising, for each i, a current mirror between said first and said second transistor.

9. The circuit of claim 1 wherein said voltages $U_0 \ldots U_{M-1}$ are applied between said control terminal and said first current terminal of said transistors $T_0 \ldots T_{M-1}$.

10. The circuit of claim 1 comprising a first and a second set of transistors and a first and second multiplier/adder, wherein the first multiplier/adder is associated with the first set of transistors and the second multiplier/adder is associated with the second set of transistors, and further comprising a first multiplier matrix for multiplying at least part of the currents from said first set of transistors with at least part of the currents from said second set of transistors.

11. The circuit of claim 1 further comprising a second multiplier matrix for multiplying at least some of the currents from the transistors $T_0 \ldots T_{M-1}$ with feedback factors $\mu_{i,fb}$.

12. The circuit of claim 1 wherein said circuit is a demodulator for demodulating the signal y having the set of i=0 ... M−1 expected values $h \cdot s_i$.

13. The circuit of claim 1 wherein said circuit is a vector quantization device.

14. A method for calculating a set of M>2 values $f(y, s_i)$ with i=0 ... M−1, from values $s_0 \ldots s_{M-1}$ and a value y, wherein $$f(y, s_i) \propto \exp((2yhs_i - (hs_i)^2)/(2\sigma^2))$$

for given constants h and $\sigma$, where "$\propto$" denotes equality up to a scale factor that does not depend on i, said method comprising the steps of providing M transistors $T_0 \ldots T_{M-1}$, each of said transistors having a control terminal and two current terminals, wherein a voltage $V_{gate}$ at said control terminal essentially gives rise to a current $i_0 \cdot \exp((\kappa \cdot V_{gate} - V_{source})/U_T)$ through said current terminals, wherein $V_{source}$ is a voltage at a first of said current terminals and $i_0$, $\kappa$ and $U_T$ are constants dependent on transistor technology and design, wherein said transistors $T_0 \ldots T_{M-1}$ are connected to a common current source, generating M voltages $U_0 \ldots U_{M-1}$ having the values $$U_i = \alpha_i \cdot y + V_i$$

with $$\alpha_i = hs_i U_T/(\sigma^2 \kappa) + c$$

and $$V_i = -(hs_i)^2 U_T/(2\sigma^2 \kappa) + c',$$

wherein c and c' are arbitrary constants, and applying said voltages $U_0 \ldots U_{M-1}$ to said control terminals of said transistors $T_0 \ldots T_{M-1}$ such that currents flowing through said current terminals are indicative of said values $f(y, s_i)$.

15. A method for demodulating a signal transmitted over N>0 channels, wherein through a channel j, an actual value $y_j$ is received having a set of $i=0 \ldots M_j-1$ expected values $h_j \cdot s_{ij}$ with a variance $\sigma_j$, wherein $h_j$ is a scale factor of channel j and $s_{ij}$ is one symbol of a set $S_j$ of $M_j$ possible symbols transmitted over channel j, said method comprising the steps of for each channel j, providing $M_j$ transistors $T_0 \ldots T_{Mj-1}$, each of said transistors having a control terminal and two current terminals, wherein a voltage $V_{gate}$ at said control terminal essentially gives rise to a current $i_0 \cdot \exp((\kappa \cdot V_{gate} - V_{source})/U_T)$ through said current terminals, wherein $V_{source}$ is a voltage at a first of said current terminals and $i_0$, $\kappa$ and $U_T$ are constants dependent on transistor technology and design, wherein said transistors $T_0 \ldots T_{Mj-1}$ are connected to a common current source, for each channel j, generating $M_j$ voltages $U_{0,j} \ldots U_{Mj-1,j}$ having the values $$U_{i,j} = \alpha_i \cdot y + V_i$$

with $$\alpha_i = h_j s_{ij} U_T / (\sigma_j^2 \kappa) + c$$

and $$V_i = -(h s_i)^2 U_T / (2\sigma^2 \kappa) + c',$$

wherein c and c' are arbitrary constants, and for each channel j, applying said voltages $U_{0,j} \ldots U_{Mj-1,j}$ to said control terminals of said transistors $T_0 \ldots T_{Mj-1}$ for generating a set of currents $I_{i,j}$ indicative of the likelihoods that said actual value $y_j$ corresponds to said expected values $h_j \cdot s_{ij}$.

16. The method of claim 15 further comprising the step of multiplying the set of currents $I_{i,j}$ for obtaining products $$p_{i0,i1,\ldots,iN-1} = K \cdot I_{i0,0} \cdot I_{i1,1} \cdots I_{iN-1,N-1}$$

with K being proportional to $$1 \Big/ \prod_{j=0}^{N-1} \left( \sum_{i=0}^{M_j-1} I_{i,j} \right),$$

wherein the products $p_{i0,i1,\ldots,iN-1}$ are indicative of a likelihood of a received signal having the values $s_{i0,0}, \ldots s_{iN-1,N-1}$ in the channels $0 \ldots N-1$.

17. The method of claim 16 further comprising the step of generating currents $I_{i0,i1,\ldots,iN-1}$ proportional to the products $p_{i0,i1,\ldots,iN-1}$.

18. The method of claim 17 wherein, using the definitions
a) $T = \{(s_{i0,0}, s_{i1,1}, \ldots s_{iN-1,N-1})\}$ designates a set of all possible N-tuples $(s_{i0,0}, s_{i1,1}, \ldots s_{iN-1,N-1})$,
b) $S_k$ with $k=0$ to $K-1$ designate K subsets of the N-tuples in T, at least part of said subsets comprising more than one N-tuple,
said method further comprises the step of adding, for a given combination of actual values $\{y_0, \ldots y_{N-1}\}$, all currents $I_{i0,i1,\ldots,iN-1}$ corresponding to the N-tuples in $S_k$ for calculating a likelihood that the combination of actual values is indicative of subset $S_k$.

19. The method of claim 15 wherein N>1.

* * * * *